United States Patent
You et al.

(10) Patent No.: US 10,811,487 B2
(45) Date of Patent: Oct. 20, 2020

(54) ORGANIC LIGHT EMITTING DIODE DISPLAY AND MANUFACTURING METHOD THEREOF

(71) Applicant: Samsung Display Co., Ltd., Yongin-si (KR)

(72) Inventors: Chun Gi You, Asan-si (KR); Gwang Geun Lee, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/372,246

(22) Filed: Apr. 1, 2019

(65) Prior Publication Data

US 2019/0229179 A1 Jul. 25, 2019

Related U.S. Application Data

(62) Division of application No. 15/014,570, filed on Feb. 3, 2016, now Pat. No. 10,276,644.

(30) Foreign Application Priority Data

Aug. 13, 2015 (KR) .................. 10-2015-0114903

(51) Int. Cl.
*H01L 33/08* (2010.01)
*H01L 27/32* (2006.01)
(Continued)

(52) U.S. Cl.
CPC ...... *H01L 27/3276* (2013.01); *H01L 27/3258* (2013.01); *H01L 27/3262* (2013.01);
(Continued)

(58) Field of Classification Search
None
See application file for complete search history.

(56) References Cited

U.S. PATENT DOCUMENTS

2007/0108899 A1\* 5/2007 Jung .................. H01L 27/3276
                                                                    313/506
2007/0132365 A1   6/2007 Kang et al.
(Continued)

FOREIGN PATENT DOCUMENTS

JP       2012-33836 A       2/2012
JP       2013-058803 A      3/2013
(Continued)

OTHER PUBLICATIONS

Non-Final Office Action dated Jun. 15, 2017, issued in U.S. Appl. No. 15/014,570.
(Continued)

*Primary Examiner* — Joseph C. Nicely
*Assistant Examiner* — Lamont B Koo
(74) *Attorney, Agent, or Firm* — H.C. Park & Associates, PLC

(57) ABSTRACT

An organic light emitting diode display comprises a substrate including a display area in which a pixel is disposed and a peripheral area surrounding the display area, a driving semiconductor layer disposed in the display area on the substrate, a driving gate electrode disposed in the display area on the driving semiconductor layer, a common voltage line disposed in the peripheral area on the substrate and disposed on a same layer as the driving gate electrode, a gate electrode anti-oxidation layer disposed on the driving gate electrode, a common voltage line anti-oxidation layer disposed on the common voltage line, an interlayer insulating layer disposed on the driving semiconductor layer, the driving gate electrode, the common voltage line, the gate electrode anti-oxidation layer, and the common voltage line anti-oxidation layer.

8 Claims, 5 Drawing Sheets

(51) Int. Cl.
  *H01L 29/49* (2006.01)
  *H01L 29/786* (2006.01)
  *H01L 27/12* (2006.01)
  *H01L 51/52* (2006.01)

(52) U.S. Cl.
  CPC ...... *H01L 27/3279* (2013.01); *H01L 29/4908* (2013.01); *H01L 29/78606* (2013.01); *H01L 27/124* (2013.01); *H01L 27/1237* (2013.01); *H01L 27/1255* (2013.01); *H01L 27/1259* (2013.01); *H01L 51/525* (2013.01)

(56) References Cited

U.S. PATENT DOCUMENTS

| | | |
|---|---|---|
| 2011/0297951 A1 | 12/2011 | Shin et al. |
| 2012/0074414 A1 | 3/2012 | Lee et al. |
| 2012/0178196 A1 | 7/2012 | Park et al. |
| 2012/0214297 A1 | 8/2012 | Cho et al. |
| 2012/0225543 A1 | 9/2012 | Ohno et al. |
| 2013/0001564 A1* | 1/2013 | Choi .................. H01L 27/3276 257/59 |
| 2013/0026475 A1 | 1/2013 | Choi et al. |
| 2014/0117860 A1 | 5/2014 | Kim et al. |

FOREIGN PATENT DOCUMENTS

| | | |
|---|---|---|
| KR | 2000-0027714 A | 5/2000 |
| KR | 10-2013-0131809 A | 12/2013 |

OTHER PUBLICATIONS

Final Office Action dated Sep. 28, 2017, issued in U.S. Appl. No. 15/014,570.
Non-Final Office Action dated Jan. 26, 2018, issued in U.S. Appl. No. 15/014,570.
Final Office Action dated Aug. 30, 2018, issued in U.S. Appl. No. 15/014,570.
Notice of Allowance dated Dec. 18, 2018, issued in U.S. Appl. No. 15/014,570.

* cited by examiner

ORGANIC LIGHT EMITTING DIODE DISPLAY AND MANUFACTURING METHOD THEREOF

CLAIM OF PRIORITY

This application is a Divisional of U.S. patent application Ser. No. 15/014,570, filed on Feb. 3, 2016, and claims priority to and the benefits accruing under 35 U.S.C. § 119 from Korean Patent Application No. 10-2015-0114903 filed in the Korean Intellectual Property Office on Aug. 13, 2015, the entire contents of which are incorporated herein by reference.

BACKGROUND

The present invention relates generally to an organic light emitting device display and a manufacturing method thereof.

An organic light emitting diode display comprises a display substrate including a display area displaying an image, a peripheral area, and an encapsulation substrate encapsulating the display substrate.

A plurality of organic light emitting diodes connected between a scan line and a data line in a matrix form to configure a pixel are formed in the display area, and the organic light emitting diode includes an anode, a cathode, and an organic emission layer formed between the anode and the cathode. In the peripheral area, the following elements are formed: a scan end and a data end extending from the scan line and the data line of the display area; a common voltage line for operating the organic light emitting diode; and a scan driver and a data driver for processing signals supplied from the outside so as to supply the processed signals to the scan end and the data end.

The above information disclosed in this Background section is only for enhancement of an understanding of the background of the described technology and therefore it may contain information that does not form the prior art that is already known in this country to a person of ordinary skill in the art.

SUMMARY

The present invention has been developed in an effort to provide an organic light emitting diode display and a manufacturing method thereof that may firmly bond an electrode layer to an insulating layer, and in which a substrate and a mask can be aligned more precisely in the manufacturing process.

Another embodiment of the invention provides an organic light emitting diode display and a manufacturing method thereof in which power loss is minimized by reducing overall electrical resistance of a common voltage line applied with a common voltage.

An exemplary embodiment of the invention provides an organic light emitting diode display including a substrate which includes a display area in which a pixel is disposed and a peripheral area surrounding the display area, a driving semiconductor layer disposed in the display area on the substrate, a driving gate electrode disposed in the display area on the driving semiconductor layer, a common voltage line disposed in the peripheral area on the substrate and disposed on the same layer as the driving gate electrode, a gate electrode anti-oxidation layer disposed on the driving gate electrode, a common voltage line anti-oxidation layer disposed on the common voltage line, an interlayer insulating layer disposed on the driving semiconductor layer, the driving gate electrode, the common voltage line, the driving gate electrode anti-oxidation layer, and the common voltage line anti-oxidation layer, a driving source electrode and a driving drain electrode disposed in the display area on the interlayer insulating layer, and a common voltage applying electrode disposed in the peripheral area on the interlayer insulating layer and disposed on the same layer as the driving source electrode and the driving drain electrode. The common voltage applying electrode is connected to the common voltage line through a first contact hole formed in the interlayer insulating layer, and the first contact hole does not overlap the common voltage line anti-oxidation layer.

The driving gate electrode and the common voltage line may include at least one material selected from the group consisting of silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), molybdenum (Mo), titanium (Ti), tungsten (W), molybdenum tungsten (MoW), and copper (Cu), and the driving gate electrode anti-oxidation layer and the common voltage line anti-oxidation layer may include a transparent conductive material.

The driving gate electrode and the common voltage line may include a first layer including aluminum (Al) and a second layer disposed on the first layer and including molybdenum (Mo), and the driving gate electrode anti-oxidation layer and the common voltage line anti-oxidation layer may include indium tin oxide (ITO).

The organic light emitting diode display may further include a passivation layer disposed on the driving source electrode, the driving drain electrode, and the first common voltage applying electrode, and a pixel layer disposed in the display area on the passivation layer and connected to the driving drain electrode.

The organic light emitting diode display may further include a pixel defining layer disposed on an edge of the pixel electrode and exposing the pixel electrode.

The organic light emitting diode display may further include an organic emission layer disposed on the exposed pixel electrode, and a common electrode disposed on the organic emission layer and the pixel defining layer.

The pixel defining layer and the passivation layer may include a second contact hole exposing a portion of the common voltage applying electrode.

The common electrode may be connected to the common voltage applying electrode through the second contact hole.

The organic light emitting diode display may further include a capacitor including a first capacitive plate and a second capacitive plate disposed with the passivation layer therebetween.

The first capacitive plate may be disposed on the same layer as the driving gate electrode.

The second capacitive plate may be disposed on the same layer as the driving source electrode and the driving drain electrode.

An exemplary embodiment provides a manufacturing method of an organic light emitting diode display, including forming a semiconductor on a substrate, forming a first insulating layer on the semiconductor, forming a driving gate electrode and a common voltage line on the first insulating layer, forming a gate electrode anti-oxidation layer and a common voltage line anti-oxidation layer on the driving gate electrode and the common voltage line, etching a portion of the common voltage anti-oxidation layer so as to expose the common voltage line, forming a second insulating layer having a contact hole on the driving gate electrode and the common voltage line, wherein the contact hole does not overlap the common voltage line anti-oxidation layer, and forming a common voltage applying electrode connected to the common voltage line through the contact hole. The forming of the driving gate electrode and the common voltage line may include forming the driving gate electrode and the common voltage with a material selected from the group consisting of silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), molybdenum (Mo), titanium (Ti), tungsten (W), molybdenum tungsten (MoW), and copper (Cu).

The forming of the driving gate electrode anti-oxidation layer and the common voltage line anti-oxidation layer may include forming the driving gate electrode anti-oxidation layer and the common voltage line anti-oxidation layer with a transparent conductive material.

The forming of the driving gate electrode and the common voltage line may include forming a first layer including aluminum (Al) and forming a second layer including molybdenum (Mo) on the first layer, and the forming of the driving gate electrode anti-oxidation layer and the common voltage line anti-oxidation layer may include forming the driving gate electrode anti-oxidation layer and the common voltage line anti-oxidation layer including indium tin oxide (ITO).

The manufacturing method of an organic light emitting diode display may further include forming a third insulating layer on the driving source electrode, the driving drain electrode, and the common voltage applying electrode, and forming a pixel electrode connected to the driving drain electrode on the third insulating layer.

The manufacturing method of an organic light emitting diode display may further include forming a pixel defining layer on the third insulating layer and an edge of the pixel electrode.

The manufacturing method of an organic light emitting diode display may further include forming an organic emission layer on the exposed pixel electrode, and forming a common electrode on the organic emission layer and the pixel defining layer.

The manufacturing method of an organic light emitting diode display may further include forming a second contact hole exposing a portion of the common voltage applying electrode in the pixel defining layer and the passivation layer.

According to the exemplary embodiment, it is possible to firmly bond an electrode layer to an insulating layer, and the substrate and the mask can be aligned more precisely in the manufacturing process.

Furthermore, power loss is minimized by reducing overall electrical resistance of the common voltage line applied with a common voltage.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
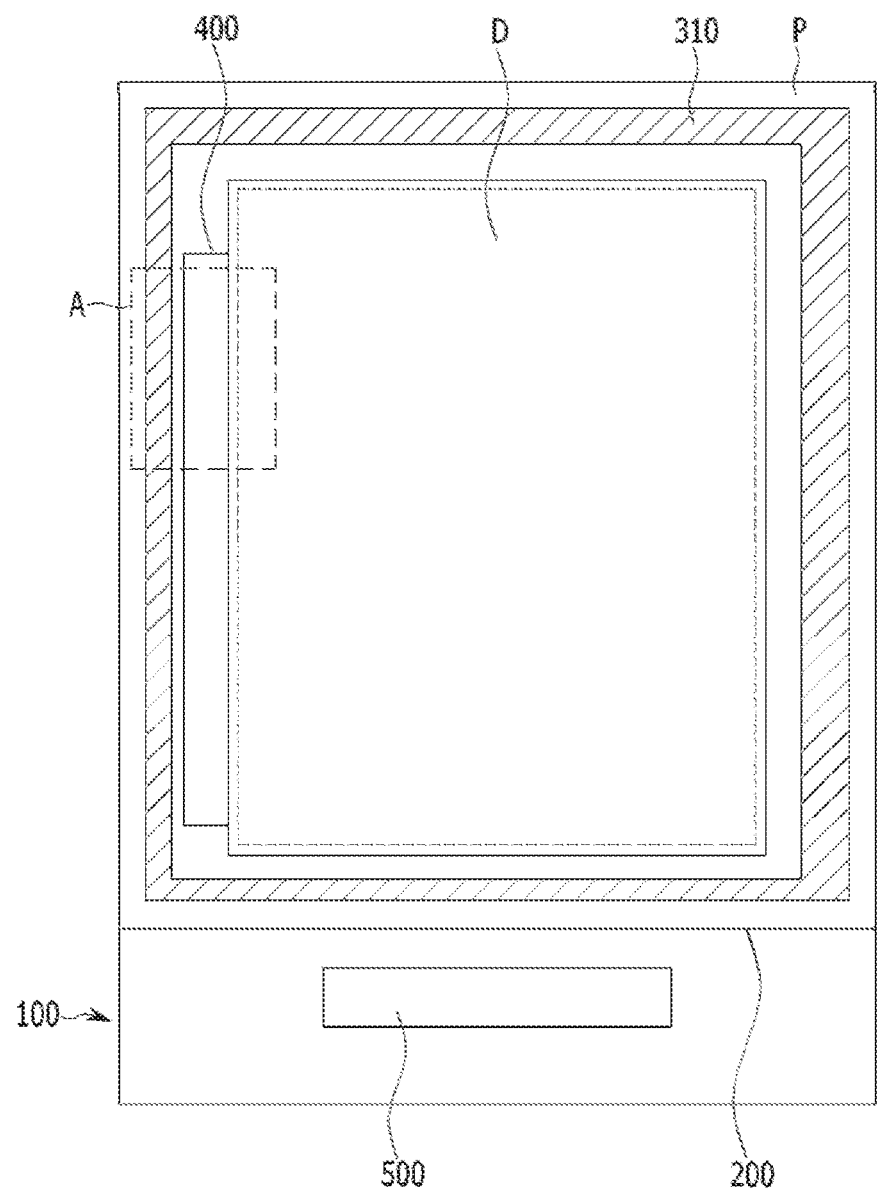
FIG. 1 is a plan view of a display area and a peripheral area of an organic light emitting diode display according to an exemplary embodiment of the invention.

Hereinafter, exemplary embodiments of the invention will be described in detail with reference to the accompanying drawings. As those skilled in the art will realize, the described embodiments may be modified in various different ways, all without departing from the spirit or scope of the present invention. On the contrary, exemplary embodiments introduced herein are provided to make disclosed contents thorough and complete, and yo sufficiently transfer the spirit of the present invention to those skilled in the art.

Furthermore, the size and thickness of each configuration shown in the drawings are arbitrarily shown for better understanding and ease of description, but the present invention is not limited thereto.

In the drawings, the thickness of layers, films, panels, regions, etc. are exaggerated for clarity. In the drawings, for better understanding and ease of description, the thickness of some layers and areas is exaggerated. It will be understood that, when an element such as a layer, film, region, or substrate is referred to as being "on" another element, it can be directly on the other element or intervening elements may also be present.

In addition, unless explicitly described to the contrary, the word "comprise" and variations such as "comprises" or "comprising" will be understood to imply the inclusion of stated elements but not the exclusion of any other elements.

Furthermore, throughout this specification, "on a plane" means when a target part is viewed from the top, and "on a cross-section" means when a cross-section of the target part vertically taken is viewed from the side.

An organic light emitting diode display according to an exemplary embodiment of the invention will now be described in detail with reference to the accompanying drawings.

Figure 2:
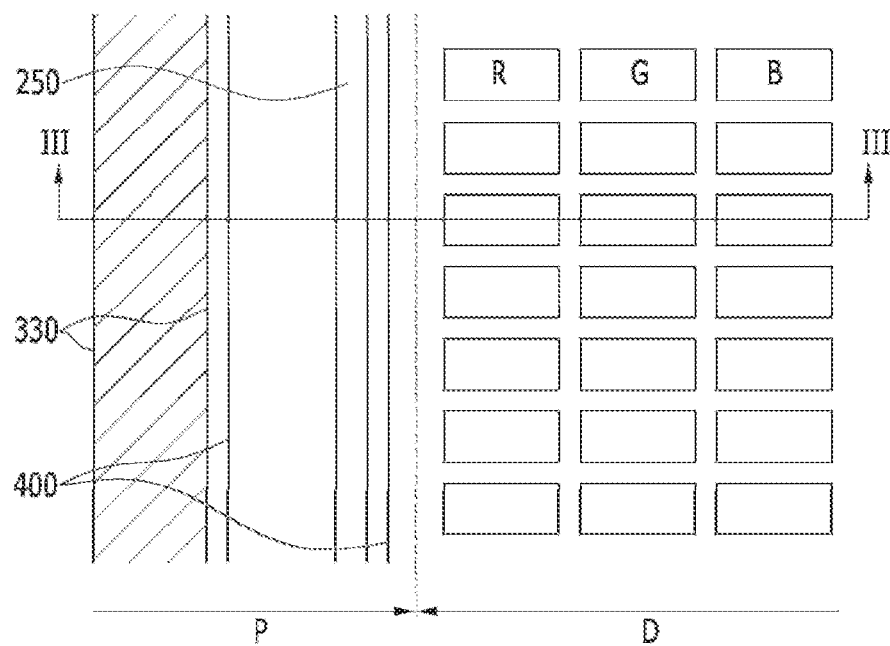
FIG. 2 is an enlarged plan view of a portion A of FIG. 1.
Figure 3:
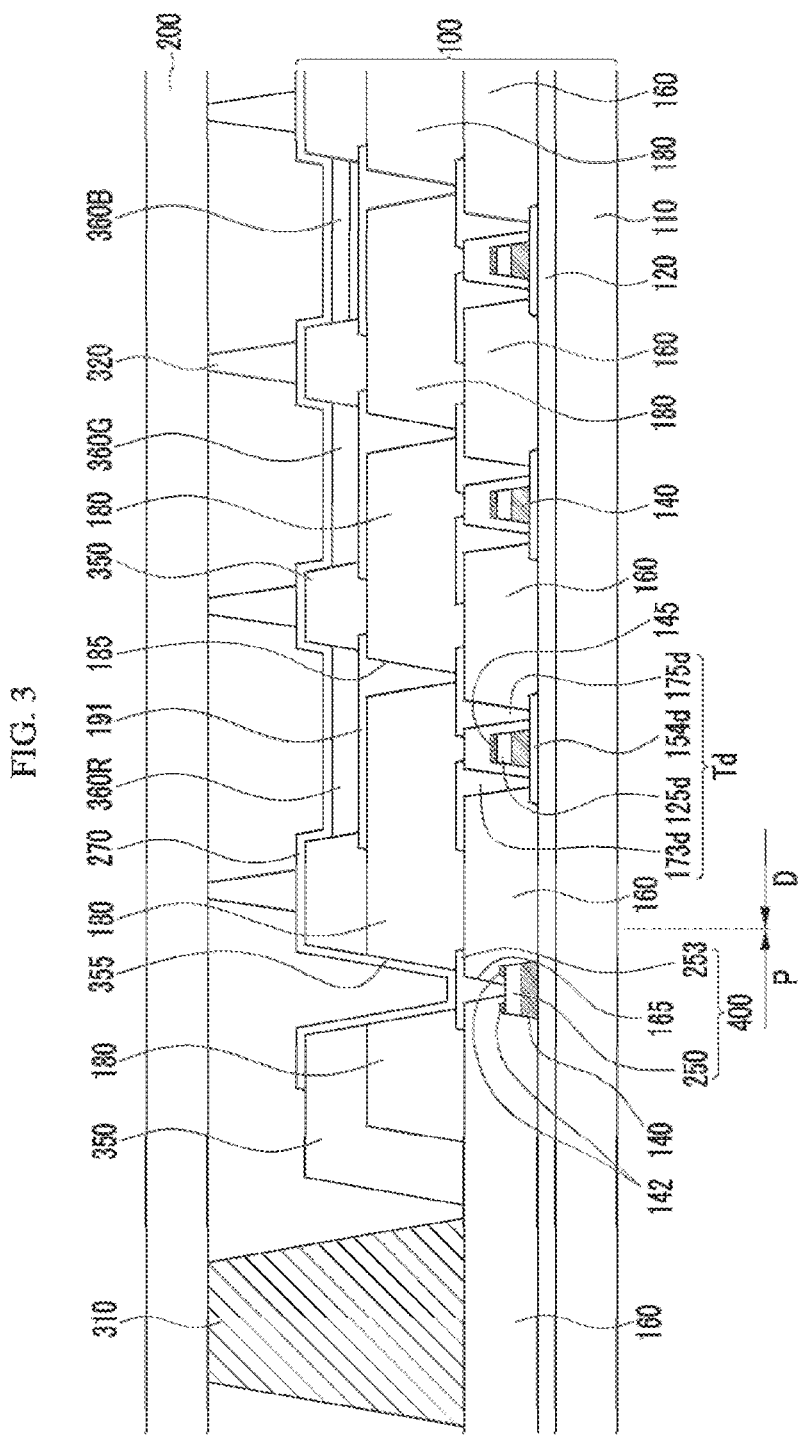
FIG. 3 is a cross-sectional view of FIG. 2 taken along line III-III.

FIG. 1 is a plan view of a display area and a peripheral area of an organic light emitting diode display according to an exemplary embodiment of the invention, FIG. 2 is an enlarged plan view of a portion A of FIG. 1, and FIG. 3 is a cross-sectional view of FIG. 2 taken along line III-III.

Referring to FIGS. 1 to 3, an organic light emitting diode display according to the exemplary embodiment includes a display substrate 100 and an encapsulation substrate 200 facing the display substrate 100.

The display substrate 100 includes a plurality of thin film layers disposed on a substrate 110 made of transparent glass or plastic, and is divided into a display area D displaying an image and a peripheral area P surrounding the display area D.

A plurality of pixels including red pixels, blue pixels, and green pixels are disposed in the display area D. Referring to FIG. 3, in each pixel, a first electrode 191, a second electrode 270, an organic light emitting diode including organic emission layers 360R, 360G, and 360B disposed between the first electrode 191 and the second electrode 270, and a driving thin film transistor Td connected to the organic light emitting diode are disposed. Furthermore, although not illustrated, a scan line and a data line connected to the driving thin film transistor Td are disposed.

In the peripheral area P, a scan driver 400 and a data driver 500 (see FIG. 1) for processing signals supplied from the outside to supply the processed signals to the scan line and the data line of the display area D are disposed.

Figure 4:
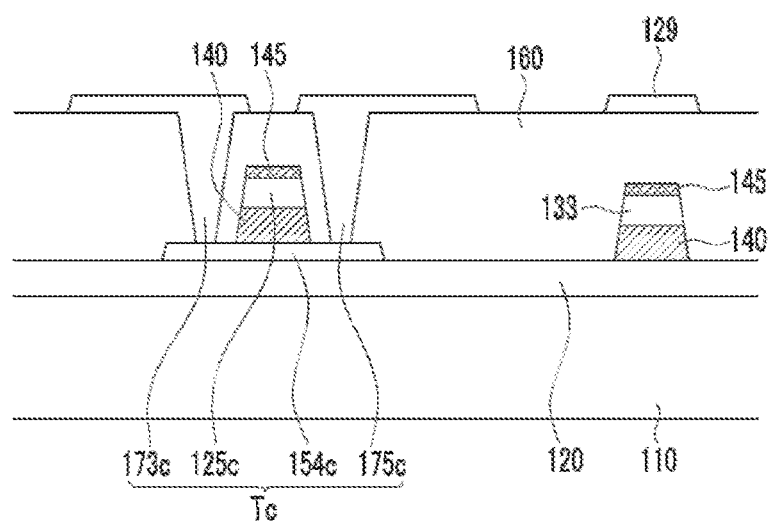
FIG. 4 is a diagram illustrating a cross-section of a peripheral thin film transistor according to the exemplary embodiment of the invention.

The scan driver 400 and the data driver 500 convert the signals supplied from the outside into a scan signal and a data signal, respectively, so as to selectively drive each pixel, and include a common voltage line 250 (see FIG. 3) to supply a common voltage to the organic light emitting diode of the display area D, a common voltage applying electrode 253, and a driving circuit part including a plurality of peripheral thin film transistors Tc (see FIG. 4).

Furthermore, in the peripheral area P, a sealant 310 (see FIGS. 1 and 3) disposed along a circumference of display area D to bond the display substrate 100 and encapsulation substrate 200. The sealant 310 includes glass frit or glass paste to prevent moisture from penetrating into the display area D.

Hereinafter, a structure of the organic light emitting diode display according to the exemplary embodiment will be described in detail according to a laminating order.

First, the display substrate 100 will be described with reference to FIG. 3.

The substrate 110 may be formed of transparent glass having silicon dioxide ($SiO_2$) as a main component. However, the substrate 110 is not limited thereto, and may be formed of various materials such as transparent plastic, metal, and the like.

An auxiliary layer 120, such as a barrier layer, a blocking layer, and/or a buffer layer, may be included on the substrate 110 to prevent spread of impurity ions, to prevent the inflow of moisture or external air, and to planarize an upper surface of the substrate 110. The auxiliary layer 120 may be formed of $SiO_2$ and/or a silicon nitride ($SiN_x$) by using various deposition methods, such as plasma-enhanced chemical vapor deposition (PECVD), atmospheric pressure chemical vapor deposition (APCVD), low pressure CVD (LPCVD), and the like.

A driving semiconductor layer 154*d* is disposed in the display area D on the auxiliary layer 120. Here, the driving semiconductor layer 154*d* may include a channel region, and a source region and a drain region which face each other with the channel region therebetween.

A first gate insulating layer 140 is disposed on the driving semiconductor layer 154*d* and the auxiliary layer 120. The first insulating layer 140 may be formed by depositing an inorganic insulating layer, such as a SiNx or a SiOx, by using PECVD, APCVD, or LPCVD. The first insulating layer 140 is interposed between the driving semiconductor layer 154*d* and a driving gate electrode 125*d* of the TFT, and functions as a gate insulating layer of the TFT.

The driving gate electrode 125*d* is disposed on the first insulating layer 140 of the display area D. The driving gate electrode 125*d* is overlapped with the driving semiconductor layer 154*d*, but is separated from the scan line. Here, the driving gate electrode 125*d* may be overlapped with the channel region of the driving semiconductor layer 154*d*. The driving gate electrode 125*d* may include at least one material selected from the group consisting of silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), molybdenum (Mo), titanium (Ti), tungsten (W), molybdenum tungsten (MoW), and copper (Cu). For example, the driving gate electrode 125*d* may be formed of a double-layered structure that includes Al—Mo or a triple-layered structure that includes Mo—Al—Mo.

The common voltage line 250 is disposed on the first insulating layer 140 of the peripheral area P. According to the exemplary embodiment, the common voltage line 250 of the organic light emitting diode display may be disposed on the same layer as the driving gate electrode 125*d*, and materials of the common voltage line 250 and the driving gate electrode 125*d* may be the same.

A gate electrode anti-oxidation layer 145 is disposed on the driving gate electrode 125*d* of the display area D. The gate electrode anti-oxidation layer 145 suppresses oxidation of the driving gate electrode 125*d* occurring in a heat treatment process of the semiconductor layer, and may include at least one transparent material selected from the group consisting of indium tin oxide (ITO), indium zinc oxide (IZO), zinc oxide (ZnO), or indium oxide ($In_2O_3$).

In the process of forming the organic light emitting device, the upper and lower layers of the multi-layered circuit patterns have to be accurately overlapped with each other. In general, however, oxidation of the driving gate electrode occurs during a heat treatment process of the semiconductor layer. Particularly, in a case in which the gate electrode material includes molybdenum (Mo), by oxidation of molybdenum (Mo), an oxidation layer is formed on the driving gate electrode 125*d* and the common voltage line 250 including the gate electrode formation material. Accordingly, the substrate and the mask are not accurately aligned, and circuit layers are poorly patterned such that light interference occurs. Furthermore, the gate electrode may be weakly bonded to the insulating layer disposed on the gate electrode due to an oxidation layer.

However, according to the exemplary embodiment, since the anti-oxidation layer is formed on the gate electrode, a contact defect due to corrosion may be prevented. In addition, the substrate and the mask can be aligned more precisely. Therefore, according to the exemplary embodiment, since the multi-layered circuit layer is precisely overlapped, the light interference may be reduced. Furthermore, since the oxidation of the gate electrode is prevented, the gate electrode may be bonded more firmly to the insulating layer disposed on the gate electrode.

A common voltage line anti-oxidation layer 142 is disposed on the common voltage line 250 of the peripheral area P. The common voltage line anti-oxidation layer 142 suppresses oxidation of the common voltage line 250 occurring in a heat treatment process of the semiconductor layer. According to the exemplary embodiment, the common voltage line anti-oxidation layer 142 of the organic light emitting diode display may be disposed on the same layer as the gate electrode anti-oxidation layer 145, and materials of the common voltage line anti-oxidation layer 142 and the gate electrode anti-oxidation layer 145 may be the same.

In this case, according to the present exemplary embodiment, a portion of the common voltage line anti-oxidation layer 142 is removed so as to not overlap with the common (second) electrode 270 and the common voltage applying electrode 253. A transparent conductive metal oxide, which is the common voltage line anti-oxidation layer 142, has relatively high electrical resistance. Accordingly, a driving voltage and power consumption of an organic light-emitting display apparatus may be increased.

However, according to the exemplary embodiment, since the portion of the common voltage line anti-oxidation layer 142 which overlaps the common voltage applying electrode 253 is removed, the common voltage line 250 and the common electrode 270 are not overlapped with the common voltage line anti-oxidation layer 142 including a transparent conductive metal oxide. As a result, overall electrical resistance of the common voltage line 250 is reduced. Accordingly, a voltage drop of the common electrode 270, which contacts the common voltage line 250, is reduced, and power loss that may be caused by electrical resistance is minimized.

A second insulating layer 160 is disposed on an entire surface of the substrate 110 on which the driving gate electrode 125d is formed. The second insulating layer 160 functions as an interlayer insulating layer between the driving electrode 125d of the TFT and source and drain electrodes 173d and 175d, respectively. The second insulating layer 160 may be formed by using at least one material selected from the group consisting of organic insulating materials such as polyimide, polyamide, acryl resin, benzocyclo-butene (BCB), and phenolic resin, as well as the inorganic insulating material described above. The second insulating layer 160 may also be formed by alternating the organic insulating material and the inorganic insulating material.

The driving source electrode 173d and the driving drain electrode 175d are disposed on the second insulating layer 160 of the display area D. A plurality of contact holes exposing a portion of the driving semiconductor layer 154d are formed in the second insulating layer 160 of the display area D, and the driving source electrode 173d and the driving drain electrode 175d are connected to the driving semiconductor layer 154d through each contact hole. Here, the driving source electrode 173d may be connected to the source region of the driving semiconductor layer 154d, and the driving drain electrode 175d may be connected to the drain region of the driving semiconductor layer 154d. Furthermore, materials of the driving source electrode 173d and the driving drain electrode 175d may be the same.

The driving semiconductor layer 154d, the driving gate electrode 125d, the driving source electrode 173d, and the driving drain electrode 175d form a driving thin film transistor Td.

The common voltage applying electrode 253 is disposed on the second insulating layer 160 of the peripheral area P. A first contact hole 165 exposing a portion of the common voltage line 250 is formed in the second insulating layer 160 of the peripheral area P, and the common voltage applying electrode 253 is connected to the common voltage line 250 through the first contact hole 165. Here, a material of the common voltage applying electrode 253 may be the same as the materials of the driving source electrode 173d and the driving drain electrode 175d.

A third insulating layer 180 covering the driving source electrode 173d, the driving drain electrode 175d, and the common voltage applying electrode 253 is disposed on the second insulating layer 160. The third insulating layer 180 is disposed up to a portion corresponding to the common voltage line 250 of the peripheral area P, and functions as a passivation layer to protect the driving transistor Td.

A pixel (first) electrode 191 is disposed on the third insulating layer 180 of the display area D. A hole 185 exposing a portion of the driving drain electrode 175d is formed in the third insulating layer 180 of the display area D, and the pixel electrode 191 is connected to the driving drain electrode 175d through the hole 185.

A pixel defining layer 350 is disposed on an edge of the pixel electrode 191 and the third insulating layer 180.

The pixel electrode 191 of the pixel defining layer 350 of the display area D is exposed, and the organic emission layers 360R, 360G, and 360B are disposed on the exposed pixel electrode 191. The common electrode 270 is disposed on the organic emission layers 360R, 360G, and 360B and the pixel defining layer 350.

The pixel electrode 191, the organic emission layers 360R, 360G, and 360B, and the common electrode 270 form the organic light emitting diode. Here, the pixel electrode 191 is an anode which is a hole injection electrode, and the common electrode 270 is a cathode which is an electron injection electrode. However, the exemplary embodiment is not necessarily limited thereto, and according to a driving method of the organic light emitting diode display, the pixel electrode 191 may be the cathode, and the common electrode 270 may be the anode. Holes and electrons from the pixel electrode 191 and the common electrode 270 are injected into the organic emission layers 360R, 360G, and 360B, and when excitons formed when the injected holes and electrons are coupled with each other fall from an excited state to a ground state, light is emitted.

The organic emission layers 360R, 360G, and 360B may be made of low-molecular organic materials or high-molecular organic materials. Furthermore, the organic emission layers 360R, 360G, and 360B may be formed as a multilayer including an emission layer, and as one or more of a hole injection layer (HIL), a hole transporting layer (HTL), an electron transporting layer (ETL), and an electron injection layer (EIL). In the case where the organic emission layers 360R, 360G, and 360B include all of the layers, the hole injection layer (HIL) is disposed on the first electrode 191 which is an anode, and the hole transporting layer (HTL), the emission layer, the electron transporting layer (ETL), and the electron injection layer (EIL) are sequentially laminated thereon. Since the common electrode 270 is made of a reflective conductive material, a bottom emission type of organic light emitting diode display is formed. The reflective material may be a material such as lithium (Li), calcium (Ca), lithium fluoride/calcium (LiF/Ca), lithium fluoride/aluminum (LiF/Al), aluminum (Al), silver (Ag), magnesium (Mg), or gold (Au).

In the pixel defining layer 350 and the third insulating layer 180 of the peripheral area P, a second contact hole 355 exposing a portion of the common voltage applying electrode 253 is formed, and the common electrode 270 is connected to the common voltage applying electrode 253 through the second contact hole 355.

The encapsulation substrate 200 is disposed on the display substrate 100, and the encapsulation substrate 200 and the display substrate 100 maintain a gap therebetween by means of a spacer 320.

The spacer 320 is disposed in the display area D, and is disposed at a portion corresponding to the pixel defining layer 350 on the common electrode 270.

The sealant 310 bonds the display substrate 100 and the encapsulation substrate 200. The sealant 310 includes glass frit or glass paste to prevent moisture from penetrating into the display area D.

Meanwhile, the scan driver 400 and the data driver 500 of the peripheral area P of FIG. 1 include a driving circuit part including the plurality of peripheral thin film transistors Tc of FIG. 4, and the peripheral thin film transistors Tc will be described in detail with reference to FIG. 4.

FIG. 4 is a diagram illustrating a cross section of a peripheral thin film transistor according to the exemplary embodiment of the invention.

Referring to FIG. 4, the peripheral thin film transistor Tc includes a peripheral semiconductor layer 154c, a peripheral gate electrode 125c, a peripheral source electrode 173c, and a peripheral drain electrode 175c. The peripheral source electrode 173c and the peripheral drain electrode 175c face each other with the peripheral gate electrode 125c therebetween.

The auxiliary layer 120 is disposed on the substrate 110, and the peripheral semiconductor layer 154c, the first insulating layer 140, and the peripheral gate electrode 125c are sequentially disposed on the auxiliary layer 120. The peripheral gate electrode 125c is overlapped with the peripheral semiconductor layer 154c.

Here, the peripheral semiconductor layer 154c may include a channel region, and a source region and a drain region which face each other with the channel region therebetween. The peripheral gate electrode 125c may be overlapped with the channel region of the peripheral semiconductor layer 154c. Furthermore, a material of the peripheral gate electrode 125c may be the same as a material of the driving gate electrode 125d. In other words, the peripheral gate electrode 125c may include at least one material selected from the group consisting of silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), molybdenum (Mo), titanium (Ti), tungsten (W), molybdenum tungsten (MoW), and copper (Cu). For example, the peripheral gate electrode 125c may be formed of a double-layered structure that includes Al—Mo or a triple-layered structure that includes Mo—Al—Mo.

The gate electrode anti-oxidation layer 145 is disposed on the peripheral gate electrode 125c. The gate electrode anti-oxidation layer 145 suppresses oxidation of the driving gate electrode 125d occurring in a heat treatment process of the semiconductor layer, and may include at least one transparent material selected from the group consisting of indium tin oxide (ITO), indium zinc oxide (IZO), zinc oxide (ZnO), or indium oxide ($In_2O_3$).

The second insulating layer 160 is disposed on an entire surface of the substrate 110 on which the peripheral gate electrode 125c is formed. The peripheral source electrode 173c and the peripheral drain electrode 175c are disposed on the second insulating layer 160. The peripheral source electrode 173c and the peripheral drain electrode 175c are connected to the peripheral semiconductor layer 154c. Here, the peripheral source electrode 173c may be connected to the source region of the peripheral semiconductor layer 154c, and the peripheral drain electrode 175c may be connected to the drain region of the peripheral semiconductor layer 154c. Furthermore, materials of the peripheral source electrode 173c and the peripheral drain electrode 175c may be the same as materials of the driving source electrode 173d and the driving drain electrode 175d.

The scan driver 400 and the data driver 500 of the peripheral area P include a capacitor adjacent to the peripheral thin film transistor.

The capacitor includes a first capacitive plate 133 and a second capacitive plate 129 disposed with the second insulating layer 160 therebetween. The first capacitive plate 133 is disposed on the first insulating layer 140, and the second capacitive plate 129 is disposed on the second insulating layer 160. The first capacitive plate 133 and the second capacitive plate 129 are overlapped with each other.

Here, the second insulating layer 160 is a dielectric material, and a storage capacitance is determined by a charge stored in the capacitor and a voltage difference between the first and second capacitive plates 133 and 129, respectively.

Here, a material of the first capacitive plate 133 may be the same as a material of the peripheral gate electrode 125c, and a material of the second capacitive plate 129 may be the same as a material of the peripheral source and drain electrodes 173c and 175c, respectively.

Meanwhile, one pixel of the organic light emitting diode display according to the exemplary embodiment may include six thin film transistors and two capacitors. The pixel will be described in detail with reference to FIG. 5.

Figure 5:
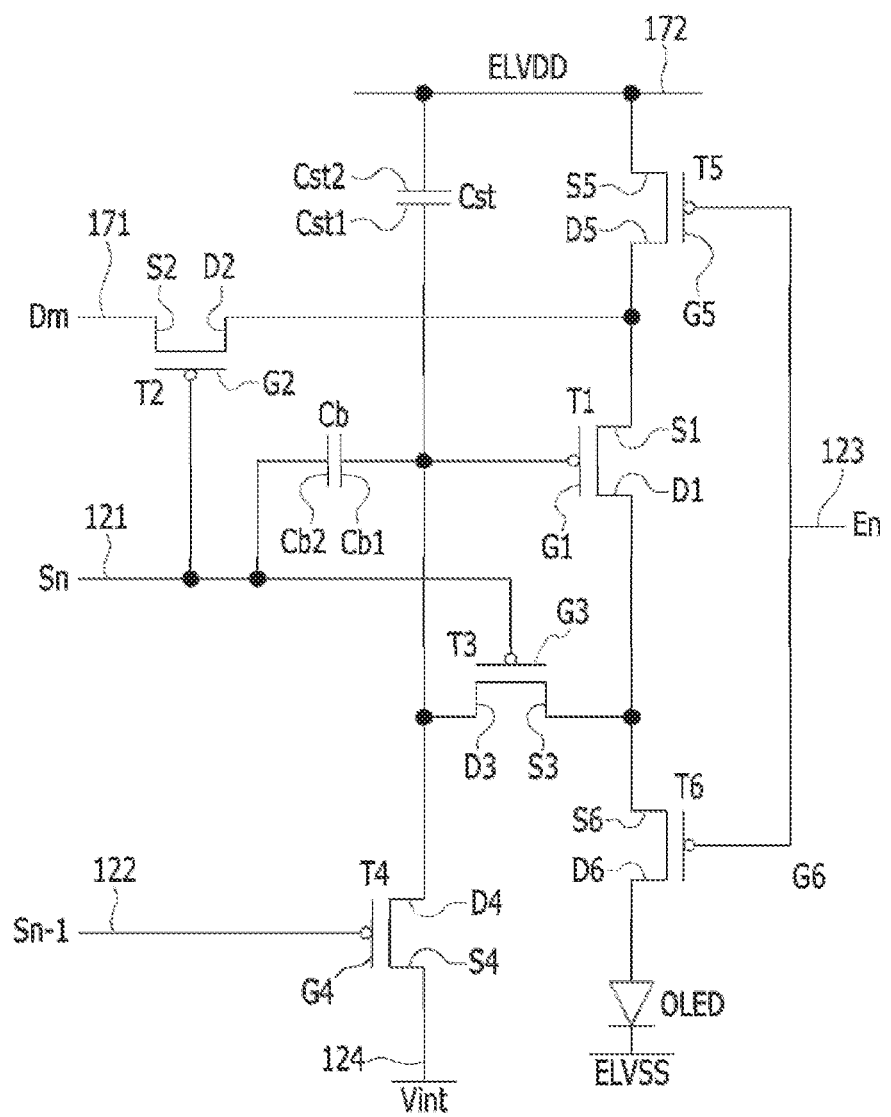
FIG. 5 is an equivalent circuit diagram for one pixel of the organic light emitting diode display according to the exemplary embodiment of the invention.

FIG. 5 is an equivalent circuit diagram of one pixel of the organic light emitting diode display according to the exemplary embodiment of the invention.

Referring to FIG. 5, one pixel of the organic light emitting diode display according to the exemplary embodiment includes a plurality of signal lines 121, 122, 123, 124, 171 and 172, a plurality of thin film transistors T1, T2, T3, T4, T5 and T6 connected to the plurality of signal lines, capacitors Cst and Cb, and an organic light emitting diode OLED.

The thin film transistors include a driving thin film transistor T1, a switching thin film transistor T2, a compensating thin film transistor T3, an initializing thin film transistor T4, a first emission control thin film transistor T5, and a second emission control thin film transistor T6. The capacitors include a storage capacitor Cst and a boosting capacitor Cb.

The signal lines include a scan line 121 transferring a scan signal Sn to the compensating thin film transistor T3, a previous scan line 122 transferring a previous scan signal Sn-1 to the initializing thin film transistor T4, an emission control line 123 transferring an emission control signal En to the first emission control thin film transistor T5 and to the second emission control thin film transistor T6, a data line 171 transferring a data signal Dm, a driving voltage line 172 transferring a driving voltage ELVDD and formed substantially parallel with the data line 171, and an initialization voltage line 124 transferring an initial voltage Vint initializing the driving thin film transistor T1.

A gate electrode G1 of the driving thin film transistor T1 is connected to one end Cst1 of the storage capacitor Cst, a source electrode S1 of the driving thin film transistor T1 is to connected to the driving voltage line 172 via the first emission control thin film transistor T5, and a drain electrode DI of the driving thin film transistor T1 is electrically connected to an anode of the organic light emitting diode OLED via the second emission control thin film transistor T6. The driving thin film transistor T1 receives the data signal Dm according to a switching operation of the switching thin film transistor T2 so as to supply a driving current to the organic light emitting diode OLED.

A gate electrode G2 of the switching thin film transistor T2 is connected to the scan line 121, a source electrode S2 of the switching thin film transistor T2 is connected to the data line 171, and a drain electrode D2 of the switching thin film transistor T2 is connected to the source electrode S1 of the driving thin film transistor T1 and is simultaneously connected to the driving voltage line 172 via the first emission control thin film transistor T5. The switching thin film transistor T2 is turned on according to the scan signal Sn received through the scan line 121 so as to perform a switching operation transferring the data signal Dm transferred from the data line 171 to the source electrode S1 of the driving thin film transistor T1.

A gate electrode G3 of the compensating thin film transistor T3 is connected to the scan line 121, a source electrode S3 of the compensating thin film transistor T3 is connected to the drain electrode D1 of the driving thin film transistor T1 and to an anode of the organic light emitting diode OLED, and a drain electrode D3 of the compensating thin film transistor T3 is connected to one end Cb1 of the boosting capacitor Cb and to the drain electrode D4 of the initializing thin film transistor T4. The compensating thin film transistor T3 is turned on according to the scan signal Sn received through the scan line 121 so as to connect the gate electrode G1 and the drain electrode D1 of the driving thin film transistor T1 and to diode-connect the driving thin film transistor T1. Accordingly, the driving current flows through the diode-connected driving thin film transistor T1.

A gate electrode G4 of the initializing thin film transistor T4 is connected to the previous scan line 122, a source electrode S4 of the initializing thin film transistor T4 is connected to the initialization voltage line 124, and a drain electrode D4 of the initializing thin film transistor T4 is connected to one end Cb1 of the boosting capacitor Cb, to one end Cst1 of the storage capacitor Cst, to the drain electrode D3 of the compensating thin film transistor T3, and to the gate electrode G1 of the driving thin film transistor T1. The initializing thin film transistor T4 is turned on according to the previous scan signal Sn-1 received through the previous scan line 122 so as to transfer the initial voltage Vint to the gate electrode G1 of the driving thin film transistor T1 and then to perform an initialization operation initializing a voltage of the gate electrode G1 of the driving thin film transistor T1.

A gate electrode G5 of the first emission control thin film transistor T5 is connected to the emission control line 123, a source electrode S5 of the first emission control thin film transistor T5 is connected to the driving voltage line 172, and a drain electrode D5 of the first emission control thin film transistor T5 is connected to the source electrode S1 of the driving thin film transistor T1 and to the drain electrode D2 of the switching thin film transistor T2.

A gate electrode G6 of the second emission control thin film transistor T6 is connected to the emission control line 123, a source electrode S6 of the second emission control thin film transistor T6 is connected to the drain electrode D5 of the first emission control thin film transistor T5, and a drain electrode D6 of the second emission control thin film transistor T6 is electrically connected to an anode of the organic light emitting diode OLED. The first emission control thin film transistor T5 and the second emission control thin film transistor T6 are turned on according to the emission control signal En received through the emission control line 123, and the driving voltage ELVDD is transferred to the organic light emitting diode OLED, and thus the driving current flows in the organic light emitting diode OLED.

The scan line 121 connected to the gate electrode G2 of the switching thin film transistor T2 is connected to the other end Cb2 of the boosting capacitor Cb, and one end Cb1 of the boosting capacitor Cb is connected to the gate electrode G1 of the driving thin film transistor T1.

The other end Cst2 of the storage capacitor Cst is connected to the driving voltage line 172, and a cathode of the organic light emitting diode OLED is connected to the common voltage ELVSS. As a result, the organic light emitting diode OLED receives the driving current from the driving thin film transistor T1 so as to emit light, thereby displaying an image.

Hereinafter, an operational process of one pixel of the organic light emitting diode display according to the exemplary embodiment will be described in detail.

First, for an initializing period, the previous scan signal Sn-1 having a low level is supplied through the previous scan line 122. Then, the initializing thin film transistor T4 is turned on in response to the previous scan signal Sn-1 having the low level, the initial voltage Vint is supplied from the initialization voltage line 124 to the driving thin film transistor T1 through the initializing thin film transistor T4, and then the driving thin film transistor T1 is initialized.

Thereafter, for a data programming period, the scan signal Sn having a low level is supplied through the scan line 121. Then, the switching thin film transistor T2 and the compensating thin film transistor T3 are turned on in response to the scan signal Sn having the low level.

In this case, the driving thin film transistor T1 is turned on in a form of being diode-connected by the compensating thin film transistor T3, and particularly, since the driving thin film transistor T1 is initialized for the previous initializing period, the driving thin film transistor T1 is diode-connected in a forward direction. Accordingly, the data signal Dm supplied from the data line 171 passes though the switching thin film transistor T2, the driving thin film transistor T1, and the compensating thin film transistor T3, and as a result, a voltage corresponding to a difference between the data signal Dm and a threshold voltage Vth of the driving thin film transistor T1 is stored in the storage capacitor Cst.

Thereafter, when the voltage level of the scan signal Sn is changed to a high level while the supply of the scan signal Sn stops, the voltage applied to the gate electrode G1 of the driving thin film transistor T1 is changed in response to a voltage change width of the scan signal Sn by coupling of the boosting capacitor Cb. In this case, since the voltage applied to the gate electrode G1 of the driving thin film transistor T1 is changed by charge sharing between the storage capacitor Cst and the boosting capacitor Cb, a voltage change amount applied to the driving gate electrode G1 is changed in proportion to a charge sharing value between the storage capacitor Cst and the boosting capacitor Cb in addition to a voltage change width of the scan signal Sn.

Thereafter, for an emission period, the emission control signal En supplied from the emission control line 123 is changed from the high level to the low level. Then, the first emission control thin film transistor T5 and the second emission control thin film transistor T6 are turned on by the emission control signal En of the low level for the emission period. As a result, the driving voltage ELVDD passes through the first emission control thin film transistor T5, the driving thin film transistor T1, the second emission control thin film transistor T6, and the organic light emitting diode OLED through the driving voltage line 172, and the driving current flows on a path to the common voltage ELVSS.

The driving current is controlled by the driving thin film transistor T1, and the driving thin film transistor T1 generates a driving current having a magnitude corresponding to the voltage supplied to the gate electrode G1 of the driving thin film transistor T1. In this case, for the above data programming period, since a voltage reflecting the threshold voltage of the driving thin film transistor T1 is stored in the storage capacitor Cst, the threshold voltage of the driving thin film transistor T1 is compensated for the emission period.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended.

What is claimed is:

1. A manufacturing method of organic light emitting device, comprising the steps of:
   forming a semiconductor on a substrate;
   forming a first insulating layer on the-substrate;
   forming a driving gate electrode and a common voltage line on the first insulating layer;
   forming a gate electrode anti-oxidation layer and a common voltage line anti-oxidation layer on the driving gate electrode and the common voltage line, respectively;
   etching a portion of the common voltage line anti-oxidation layer to form an opening in the common voltage line anti-oxidation layer to expose the common voltage line;
   forming a second insulating layer having a contact hole on the common voltage line, wherein the contact hole overlaps the opening of the common voltage line anti-oxidation layer; and
   forming a common voltage applying electrode connected to the common voltage line through the contact hole.

2. The method of claim 1, wherein:
   the forming of the driving gate electrode and the common voltage line comprises forming the driving gate electrode and the common voltage line with a material selected from a group consisting of silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), molybdenum (Mo), titanium (Ti), tungsten (W), molybdenum tungsten (MoVV), and copper (Cu); and
   the forming of the gate electrode anti-oxidation layer and the common voltage line anti-oxidation layer comprises forming the gate electrode anti-oxidation layer and the common voltage line anti-oxidation layer with a transparent conductive material.

3. The method of claim 2, wherein:
   the forming of the driving gate electrode and the common voltage line comprises forming a first layer comprising aluminum (Al); and forming a second layer comprising molybdenum (Mo) on the first layer; and
   the forming of the gate electrode anti-oxidation layer and the common voltage line anti-oxidation layer comprises forming the gate electrode anti-oxidation layer and the common voltage line anti-oxidation layer comprising indium tin oxide (ITO).

4. The method of claim 1, further comprising:
   forming a driving source electrode and a driving drain electrode;
   forming a third insulating layer on the driving source electrode, the driving drain electrode, and the common voltage applying electrode; and
   forming a pixel electrode connected to the driving drain electrode on the third insulating layer.

5. The method of claim 4, further comprising forming a pixel defining layer on the third insulating layer and on an edge of the pixel electrode.

6. The method of claim 1, further comprising:
   forming a driving source electrode and a driving drain electrode connected to the semiconductor through second and third contact holes,
   wherein the forming of the second insulating layer comprises forming the second insulating layer having the second and third contact holes on the semiconductor.

7. A manufacturing method of organic light emitting device, comprising the steps of:
   forming a semiconductor on a substrate;
   forming a first insulating layer on the substrate;
   forming a driving gate electrode and a common voltage line on the first insulating layer;
   forming a gate electrode anti-oxidation layer and a common voltage line anti-oxidation layer on the driving gate electrode and the common voltage line, respectively;
   etching a portion of the common voltage line anti-oxidation layer to expose the common voltage line;
   forming a second insulating layer having a contact hole on the common voltage line, wherein the contact hole does not overlap the common voltage line anti-oxidation layer;
   forming a common voltage applying electrode connected to the common voltage line through the contact hole;
   forming a driving source electrode and a driving drain electrode;
   forming a third insulating layer on the driving source electrode, the driving drain electrode, and the common voltage applying electrode;
   forming a pixel electrode connected to the driving drain electrode on the third insulating layer;
   forming a pixel defining layer on the third insulating layer and on an edge of the pixel electrode, wherein the pixel defining layer exposes a portion of the pixel electrode;
   forming an organic emission layer on the exposed portion of the pixel electrode; and
   forming a common electrode on the organic emission layer and the pixel defining layer.

8. The method of claim 7, further comprising:
   forming a second contact hole, exposing a portion of the common voltage applying electrode, in the pixel defining layer and the third insulating layer.

* * * * *